(12) United States Patent
Stauss et al.

(10) Patent No.: US 9,184,051 B2
(45) Date of Patent: Nov. 10, 2015

(54) METHOD FOR PRODUCING AN OPTOELECTRONIC NITRIDE COMPOUND SEMICONDUCTOR COMPONENT

(71) Applicant: OSRAM Opto Semiconductors GmbH, Regensburg (DE)

(72) Inventors: Peter Stauss, Regensburg (DE); Philipp Drechsel, Regensburg (DE)

(73) Assignee: OSRAM Opto Semiconductors GmbH (DE)

(*) Notice: Subject to any disclaimer, the term of this patent is extended or adjusted under 35 U.S.C. 154(b) by 0 days.

(21) Appl. No.: 14/346,787

(22) PCT Filed: Sep. 21, 2012

(86) PCT No.: PCT/EP2012/068617
§ 371 (c)(1),
(2) Date: Mar. 24, 2014

(87) PCT Pub. No.: WO2013/045355
PCT Pub. Date: Apr. 4, 2013

(65) Prior Publication Data
US 2014/0302665 A1   Oct. 9, 2014

(30) Foreign Application Priority Data
Sep. 30, 2011   (DE) .......................... 10 2011 114 665

(51) Int. Cl.
*H01L 21/02* (2006.01)
*H01L 33/00* (2010.01)
*H01L 33/12* (2010.01)

(52) U.S. Cl.
CPC ........ *H01L 21/0254* (2013.01); *H01L 21/0251* (2013.01); *H01L 21/02381* (2013.01);
(Continued)

(58) Field of Classification Search
CPC ............. H01L 33/32; H01L 29/66545; H01L 21/2807; H01L 27/3244; H01L 27/15; H01L 25/0753; H01L 33/08; H01L 21/0254; H01L 21/02381; H01L 21/02458; H01L 21/02647; Y02E 10/544; Y02E 10/50; H01J 1/34; B82Y 20/00; B82Y 30/00; G02B 6/0068

USPC ........ 438/47, 93, 94, 183; 257/11, 12, 55, 63, 257/79, 83, 85, 89, 90, 94, 96, 97, E33.003, 257/E33.023, E33.025, E33.033, E33.034, 257/E33.048; 977/825; 362/612

See application file for complete search history.

(56) References Cited

U.S. PATENT DOCUMENTS 6,187,606 B1 *  2/2001  Edmond et al. ................. 438/46
7,445,673 B2 * 11/2008  Beaumont et al. .............. 117/94
(Continued)

FOREIGN PATENT DOCUMENTS

DE     100 34 263 A1     1/2002
DE     101 51 092 A1     5/2003
(Continued)

OTHER PUBLICATIONS

Blasing J. et al., "Oxygen Induced Strain Field Homogenization in AlN nucleation Layers and its Impact on GaN Grown by Metal Organic Vapor Phase Epitaxy on Sapphire: An X-Ray Diffraction Study", Feb. 2009, Journal of Applied Physics, 105, 033504-1 and 033504-7.*

(Continued)

*Primary Examiner* — Yuanda Zhang
*Assistant Examiner* — Michael Carter
(74) *Attorney, Agent, or Firm* — DLA Piper LLP (US)

(57) ABSTRACT

A method of producing a nitride compound semiconductor component includes providing a growth substrate having a silicon surface, growing a buffer layer containing an aluminum-containing nitride compound semiconductor onto the silicon surface, growing a stress layer structure that produces a compressive stress, and growing a functional semiconductor layer sequence onto the stress layer structure, wherein the stress layer structure includes a first GaN semiconductor layer and a second GaN semiconductor layer, a masking layer is embedded in the first GaN semiconductor layer, an Al(Ga) N-intermediate layer that produces a compressive stress is disposed between the first GaN semiconductor layer and the second GaN semiconductor layer, and the stress layer structure does not contain further Al(Ga)N-intermediate layers.

15 Claims, 4 Drawing Sheets

(52) U.S. Cl.
CPC .... *H01L21/02458* (2013.01); *H01L 21/02505* (2013.01); *H01L 33/007* (2013.01); *H01L 33/12* (2013.01); *H01L 21/02639* (2013.01); *H01L 21/02647* (2013.01); *H01L 2924/0002* (2013.01)

(56) References Cited

U.S. PATENT DOCUMENTS

| | | | | |
|---|---|---|---|---|
| 7,767,307 | B2 * | 8/2010 | Semond et al. | 428/446 |
| 7,825,432 | B2 * | 11/2010 | Saxler et al. | 257/190 |
| 8,383,489 | B2 * | 2/2013 | Huang | 438/424 |
| 2008/0048207 | A1 | 2/2008 | Semond et al. | |
| 2008/0220555 | A1 | 9/2008 | Saxler et al. | |
| 2010/0133658 | A1 * | 6/2010 | Dadgar et al. | 257/615 |

FOREIGN PATENT DOCUMENTS

| | | | |
|---|---|---|---|
| DE | 102 56 911 A1 | 6/2004 | |
| DE | 10 2004 038 573 A1 | 3/2006 | |
| DE | 10 2006 008 929 A1 | 8/2007 | |
| WO | WO-2007/123496 A1 * | 11/2007 | H01L 21/00 |
| WO | 2011/039181 A1 | 4/2011 | |
| WO | 2012/025397 A1 | 3/2012 | |

OTHER PUBLICATIONS

Supratik Guha et al., "Ultraviolet and violet GaN light emitting diodes on silicon," Appl. Phys. Lett., vol. 72, No. 4, Jan. 26, 1998, pp. 415-417.

Chuong A. Tran et al., "Growth of IncGaN/GaN multiple-quantum-well blue light-emitting diodes on silicon by metalorganic vapor phase epitaxy," Applied Physics Letters, vol. 75, No. 11, Sep. 13, 1999, pp. 1494-1496.

Armin Dadgar et al., "Metalorganic Chemical Vapor Phase Epitaxy of Crack-Free GaN on Si(111) Exceeding 1 μm in Thickness," Jpn. J. Appl. Phys., vol. 39, 2000, pp. L1183-L1185.

A. Dadgar et al., "Thick, crack-free blue light-emitting diodes on Si(111) using low-temperature AlN interlayers and in situ $Si_xN_y$ masking," Applied Physics Letters, vol. 80, No. 20, May 20, 2002, pp. 3670-3672.

F. Schulze et al., "Metalorganic vapor phase epitaxy grown InGaN/GaN light-emitting diodes on Si(001) substrate," Applied Physics Letters, vol. 88, Mar. 22, 2006, pp. 121114-1-121114-3.

A. Dadgar et al., "Growth of blue GaN LED structures on 150-mm Si(111)," Journal of Crystal Growth, vol. 297, Nov. 3, 2006, pp. 279-282.

Akinori Ubukata et al., "GaN growth on 150-mm-diameter (111) Si substrates," Journal of Crystal Growth, vol. 298, Nov. 29, 2006, pp. 198-201.

Kai Cheng et al., "AlGaN/GaN HEMT grown on large size silicon substrates by MOVPE capped with in-situ deposited $Si_3N_4$," Journal of Crystal Growth, vol. 298, Dec. 5, 2006, pp. 822-825.

J. Bläsing et al., "Oxygen induced strain field homogenization in AlN nucleation layers and its impact on GaN grown by metal organic vapor phase epitaxy on sapphire: An x-ray diffraction study," Journal of Applied Physics, vol. 105, No. 3, Feb. 3, 2009, pp. 33504-1-33504-9.

* cited by examiner

METHOD FOR PRODUCING AN OPTOELECTRONIC NITRIDE COMPOUND SEMICONDUCTOR COMPONENT

TECHNICAL FIELD

This disclosure relates to a method of producing an optoelectronic nitride compound semiconductor component on a substrate having a silicon surface.

BACKGROUND

Nitride compound semiconductors are frequently used in LEDs or laser diodes which generally emit in the blue spectral range. Depending on the composition of the semiconductor material, e.g., emission in the ultraviolet or green spectral range is also possible. By reason of luminescence conversion by luminescent substances, shortwave radiation can be converted to longer wavelengths. In this manner, it is possible to produce mixed-colored light, in particular white light. Therefore, LEDs based upon nitride compound semiconductors are of considerable importance for LED illumination systems.

During the production of optoelectronic components, the nitride compound semiconductor layers are generally epitaxially grown onto a growth substrate which is adapted to the lattice constant and the crystal structure of the nitride compound semiconductor material. Suitable substrate materials are in particular sapphire, GaN or SiC. However, these substrate materials are comparatively expensive.

Growth of nitride compound semiconductors on comparatively inexpensive silicon substrates is hindered by a comparatively large difference in the coefficients of thermal expansion of the silicon and the nitride compound semiconductor material. In particular, when the layer system is cooled from the growth temperature of about 1000° C., which is used for the growth of nitride compound semiconductors, to room temperature large tensile stresses are produced in the GaN.

DE 10 2006 008 929 A1 and WO 2011/039181 A1 each describe methods of producing nitride compound semiconductor components on silicon substrates. Those publications incorporate a layer structure between the silicon surface of the growth substrate and the functional layer sequence of the optoelectronic component to produce a compressive stress which counteracts the tensile stress produced by the silicon during cooling.

It could nonetheless be helpful to provide a further improved method of producing an optoelectronic nitride compound semiconductor component on a substrate having a silicon surface by which particularly small defect densities can be attained in the functional semiconductor layer sequence to achieve particularly high levels of efficiency.

SUMMARY

We provide a method of producing a nitride compound semiconductor component including providing a growth substrate having a silicon surface, growing a buffer layer containing an aluminium-containing nitride compound semiconductor onto the silicon surface, growing a stress layer structure that produces a compressive stress, and growing a functional semiconductor layer sequence onto the stress layer structure, wherein the stress layer structure includes a first GaN semiconductor layer and a second GaN semiconductor layer, a masking layer is embedded in the first GaN semiconductor layer, an Al(Ga)N-intermediate layer that produces a compressive stress is disposed between the first GaN semiconductor layer and the second GaN semiconductor layer, and the stress layer structure does not contain further Al(Ga)N-intermediate layers.

We also provide a method of producing a nitride compound semiconductor component including providing a growth substrate having a silicon surface, growing a buffer layer containing an aluminium-containing nitride compound semiconductor onto the silicon surface, growing a stress layer structure that produces a compressive stress, and growing a functional semiconductor layer sequence onto the stress layer structure, wherein the stress layer structure includes a first GaN semiconductor layer and a second GaN semiconductor layer, a dopant concentration in the first and/or second GaN semiconductor layer is not more than $1*10^{19}$ cm$^{-3}$, a masking layer is embedded in the first GaN semiconductor layer, an Al(Ga)N-intermediate layer that produces a compressive stress is disposed between the first GaN semiconductor layer and the second GaN semiconductor layer, the stress layer structure does not contain further Al(Ga)N-intermediate layers, and a dislocation density in the functional semiconductor layer sequence is less than $5\times10^{8}$ cm$^{-2}$.

DETAILED DESCRIPTION

Figure 1:
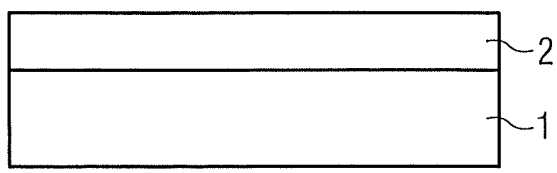
FIGS. 1 to 10 show schematic illustrations of an example of the method of producing an optoelectronic nitride compound semiconductor component by intermediate steps.

We first provide a growth substrate having a silicon surface. The growth substrate can be in particular a silicon substrate. Alternatively, the growth substrate can also be an SOI-substrate (Silicon On Insulator).

A buffer layer which has an aluminium-containing nitride compound semiconductor may be grown onto the silicon surface. In particular, the buffer layer can contain or consist of AlN. However, it is not precluded for the buffer layer to have further constituents such as, e.g., a dopant and/or small amounts of further group III materials such as, e.g., In or Ga.

The buffer layer can be grown in several sublayers which differ in terms of their composition and/or their growth parameters such as, e.g., the growth temperature or the growth rate. Preferably, during growth of the buffer layer initially a few atom layers Al are grown as the first sublayer of the buffer layer to avoid passivation of the silicon surface through formation of SiN during a reaction with nitrogen. It is only after deposition of a few atom layers Al that nitrogen is supplied during the growth process to form AlN. It is also advantageous initially to grow a second sublayer about 100 nm thick and made of AlN, at a low growth rate, and then to grow a third sublayer at a higher growth rate. In addition or as an alternative, it is also possible for the second sublayer to be grown at a lower growth temperature than the third sublayer. We found that a particularly high layer quality is achieved with this approach.

In a subsequent method step, a stress layer structure is grown to produce a compressive stress. The stress layer structure has a first GaN semiconductor layer and a second GaN semiconductor layer. The second GaN semiconductor layer follows the first GaN semiconductor layer in the growth direction of the stress layer structure.

Advantageously, a masking layer is embedded into the first GaN semiconductor layer. In particular, the masking layer can be a silicon nitride layer. The masking layer is an unclosed layer. In particular, the masking layer can be an island-like layer, i.e., a layer whose growth has been interrupted in the initial stage prior to the growing together of the crystallites, to form a closed layer. The masking layer can have, e.g., an average thickness of about 0.2 nm to 2 nm.

A part of the first GaN semiconductor layer is grown on the masking layer. For example, the first GaN semiconductor layer is produced such that initially a first sublayer of the first GaN semiconductor layer is grown, then the masking layer is grown onto the first sublayer and, subsequently, the second sublayer of the first GaN semiconductor layer is grown onto the masking layer.

Advantageously, we found that a reduction in the dislocation density can be achieved in the stress layer structure and a subsequent functional semiconductor layer sequence by embedding a masking layer of this type into the first GaN semiconductor layer.

Advantageously, an Al(Ga)N intermediate layer is disposed between the first GaN semiconductor layer and the second GaN semiconductor layer. Preferably, the intermediate layer contains or consists of AlN. However, it is not precluded for the intermediate layer to contain small amounts of gallium and/or a dopant. By virtue of the fact that the Al-containing nitride semiconductor material of the intermediate layer has a smaller lattice constant than GaN, a compressive stress is produced in the subsequent second GaN semiconductor layer. Although advantageously a compressive stress is already present in the first GaN semiconductor layer by reason of the growth on the aluminium-containing buffer layer, in particular an AlN buffer layer, this type of compressive stress can then be reduced during the growth of the first GaN semiconductor layer by formation of dislocations. Insertion of the AlN intermediate layer between the first GaN semiconductor layer and the second GaN semiconductor layer ensures that even in the second GaN semiconductor layer a sufficiently large compressive stress is built up which, during cooling of the layer system from the growth temperature to room temperature, counteracts a tensile stress produced by the substrate.

In a further method step, the functional semiconductor layer sequence of the optoelectronic nitride semiconductor component is grown onto the stress layer structure. The functional semiconductor layer sequence contains in particular an active layer of the optoelectronic component. The active layer can be, e.g., a radiation-emitting layer or a radiation-receiving layer. In addition to the active layer, the functional semiconductor layer sequence can have, e.g., an n-type semiconductor region and a p-type semiconductor region which surround the active layer.

The functional semiconductor layer sequence of the optoelectronic component is based upon a nitride compound semiconductor. In this context, the phrase "based upon a nitride compound semiconductor" means that the semiconductor layer sequence or at least a layer thereof comprises a III-nitride compound semiconductor material, preferably $In_xAl_yGa_{1-x-y}N$, where $0 \leq x \leq 1$, $0 \leq y \leq 1$ and $x+y \leq 1$. This material does not necessarily have to have a mathematically exact composition in accordance with the formula above. Rather, it can have one or several dopants and additional constituents which do not substantially change the characteristic physical properties of the $In_xAl_yGa_{1-x-y}N$ material. However, for the sake of simplicity, the above formula includes only the essential constituents of the crystal lattice (In, Al, Ga, N), even if they can be replaced in part by small amounts of further substances.

Apart from the Al(Ga)N-intermediate layer, the stress layer structure advantageously does not contain any further Al(Ga)N intermediate layers. Therefore, the stress layer structure consists advantageously of the first GaN semiconductor layer with the masking layer contained therein, the Al(Ga)N intermediate layer and the second GaN semiconductor layer, and preferably does not contain any further layers. In particular, the stress layer structure only contains precisely one Al(Ga)N intermediate layer.

We found that a particularly low dislocation density can be achieved with the stress layer structure described in this case. On the one hand, this is based upon the fact that a reduction in the dislocation density is achieved by embedding the masking layer into the first GaN semiconductor layer. The dislocation density which is reduced in this manner has the advantage that the compressive stress built up in the semiconductor material is relaxed to a less significant extent in the growth direction than in a semiconductor material having a higher dislocation density. In fact, we found that dislocations in the semiconductor material lead to a reduction in the compressive stress, which means that conventionally several intermediate layers are required to then build up the compressive stress in the GaN semiconductor material a number of times. However, a plurality of such intermediate layers can produce additional new dislocations in the subsequent layers. Since the method described herein does not use further Al(Ga)N intermediate layers and instead uses only a single Al(Ga)N intermediate layer, a particularly low dislocation density is achieved in the stress layer structure and the subsequent functional semiconductor layer sequence.

Preferably, the dislocation density in the functional semiconductor layer sequence is less than $1 \times 10^9$ cm$^{-2}$. Particularly preferably, the dislocation density in the functional semiconductor layer sequence is less than $5 \times 10^8$ cm$^{-2}$.

Preferably, the aluminium-containing buffer layer is doped with oxygen. We found that by doping the buffer layer with oxygen a further improvement in the crystal structure of the subsequent layers and an even lower dislocation density can be achieved.

By virtue of the fact that the compressive stress in the first GaN semiconductor layer and/or the second GaN semiconductor layer relaxes only comparatively slowly by reason of the achieved low dislocation density as the layer thickness increases, the first GaN semiconductor layer and the second GaN semiconductor layer can advantageously be designed to be comparatively thick.

Preferably, the first GaN semiconductor layer has a thickness of 500 nm or more, particularly preferably 1000 nm or more. For example, the first GaN semiconductor layer can be about 1300 nm thick.

The second GaN semiconductor layer preferably has a thickness of 1000 nm or more. For example, the second GaN semiconductor layer can have a thickness of about 1400 nm.

The total thickness of the stress layer is preferably 2 μm or more, particularly preferably 3 μm or more.

A comparatively low dislocation density can also be advantageously achieved with the method described herein if the first and/or the second GaN semiconductor layer are doped. Preferably, the dopant concentration in the first and/or second GaN semiconductor layer is not more than $1 \times 10^{19}$ cm$^{-3}$. An even higher dopant concentration could otherwise possibly lead to an increase in dislocations.

In particular, the first and/or the second GaN semiconductor layer can be n-doped. For example, for the purpose of n-doping, Si can be used as the dopant.

One or several transition layers consisting of $Al_xGa_{1-x}N$ with $0 < x < 1$ may be disposed between the aluminium-containing buffer layer and the stress layer. In the transition layer(s), the aluminium content x decreases preferably gradually or continuously in the growth direction.

The masking layer may comprise a silicon nitride. The thickness of the masking layer is preferably on average less than 2 nm, e.g., 0.2 nm to 2 nm. The masking layer is thus preferably only a few monolayers or even only one monolayer thick.

Preferably, the silicon surface of the growth substrate is a (111)-plane. By reason of the hexagonal crystal structure, the (111)-plane of a silicon crystal is particularly suitable for growing a hexagonal nitride compound semiconductor material.

Preferably, the growth substrate is detached after growth of the functional semiconductor layer sequence. In this instance, the functional semiconductor layer sequence connects to a carrier substrate in an advantageous manner at a surface opposite to the growth substrate. Since the carrier substrate does not have to be suitable for growing a nitride compound semiconductor material, it can be selected in an advantageous manner on the basis of other criteria, in particular good thermal and/or electrical conductivity. Furthermore, in this instance, a reflective layer can be applied to the functional semiconductor layer sequence prior to connecting the functional semiconductor layer sequence to the carrier substrate to reflect the radiation, which during operation of the optoelectronic nitride compound semiconductor component is emitted in the direction of the carrier substrate, to a radiation exit surface opposite to the carrier substrate.

After detachment of the growth substrate, the buffer layer and the stress layer structure can be removed at least partially, e.g., by an etching method. In this case, a remainder of the stress layer structure, which remains in the optoelectronic component, is disposed on the radiation exit side of the optoelectronic component.

Our methods and components will be explained hereinafter with reference to examples in conjunction with FIGS. 1 to 10.

Like parts, or parts acting in an identical manner, are provided with the same reference numerals in each case in the figures. The illustrated parts and the size ratios of the parts with respect to each other are not to be regarded as being to scale.

In the case of the method, a growth substrate 1 is provided, as illustrated in FIG. 1, which has a silicon surface. The growth substrate 1 can be, e.g., a silicon wafer. However, it is alternatively also possible for the growth substrate 1 to be an SOI substrate. The silicon surface of the growth substrate 1 is preferably a (111)-crystal plane which, due to its hexagonal symmetry, is particularly well suited for growing nitride compound semiconductors. In comparison to substrates consisting of sapphire, GaN or SiC which are generally used to grow nitride compound semiconductor materials, the growth substrate 1 having the silicon surface has the advantage that it is comparatively inexpensive.

Initially, a buffer layer 2 consisting of an aluminium-containing nitride compound semiconductor material is grown onto the silicon surface of the growth substrate 1. Preferably, the buffer layer 2 contains or consists of AlN. The buffer layer 2 preferably has a thickness of 100 nm to 300 nm, e.g., about 200 nm.

The buffer layer 2 can be grown in several sublayers (not illustrated) which differ in terms of their composition and/or their growth parameters such as, e.g., the growth temperature or the growth rate. Preferably, during growth of the buffer layer 2 a few atom layers Al are initially grown as the first sublayer of the buffer layer 2 to avoid passivation of the silicon surface through formation of SiN in a reaction with nitrogen. Only after a few atom layers Al have been deposited, nitrogen is supplied during the growth process to form AlN. It is also advantageous initially to grow an approximately 100 nm thick second sublayer consisting of AlN at a low growth rate and thereafter to grow a third sublayer at a higher growth rate. It is additionally or alternatively also possible for the second sublayer to be grown at a lower growth temperature than the third sublayer. We found that a particularly high layer quality is achieved with this approach.

Particularly advantageously, the buffer layer 2 is formed from an oxygen-doped AlN semiconductor material. The oxygen content in the AlN:O-layer is preferably 0.1% to 5%, particularly preferably 1% to 5%. We found that when this type of oxygen-doped AlN-buffer layer is used, an improvement in the crystal quality, in particular a reduction in the dislocation density, can be achieved in the subsequently applied layers.

Figure 2:
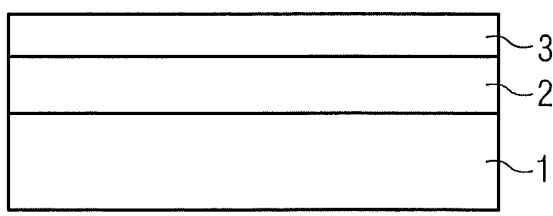

In the intermediate step illustrated in FIG. 2, a transition layer 3 consisting of $Al_xGa_{1-x}N$ is applied to the buffer layer 2. The transition layer 3 has preferably in the growth direction a varying aluminium proportion x, wherein the aluminium proportion decreases in the growth direction. Alternatively, it is also possible to apply, e.g., several transition layers in which the aluminium proportion x decreases, e.g., gradually from layer to layer. Application of one or several transition layers 3 is an optional intermediate step which can also be omitted where appropriate.

Figure 3:
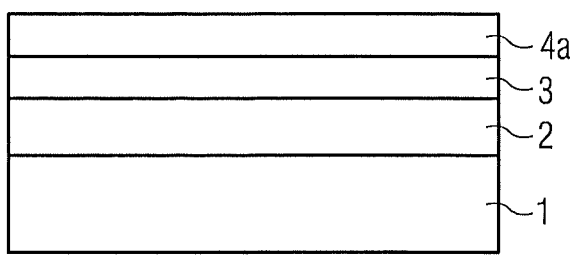

In the method step illustrated in FIG. 3, a first sublayer 4a of a first GaN semiconductor layer is grown onto the transition layer 3 or, if no transition layer 3 has been applied, onto the buffer layer 2. The first sublayer 4a is preferably about 100 nm to 300 nm thick.

Figure 4:
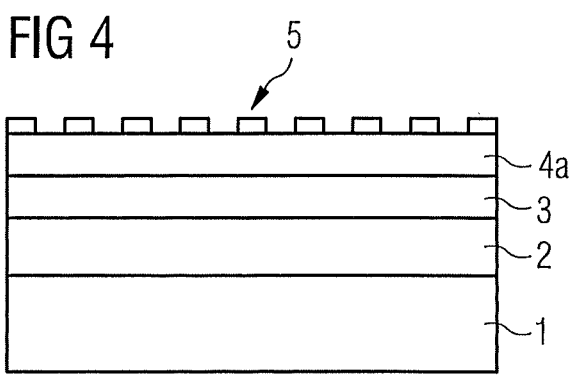

After growth of the first sublayer 4a, a masking layer 5 is applied to the first sublayer 4a, as illustrated in FIG. 4. The masking layer 5 preferably contains or consists of a silicon nitride. The masking layer 5 preferably has on average a thickness of about 0.2 nm to about 2 nm. In particular, the masking layer 5 can be an island-like layer, i.e., a layer whose growth was interrupted in the initial stage before the crystallites formed on the growth surface have grown together to form a closed layer. The masking layer 5 thus has a multiplicity of openings.

Figure 5:
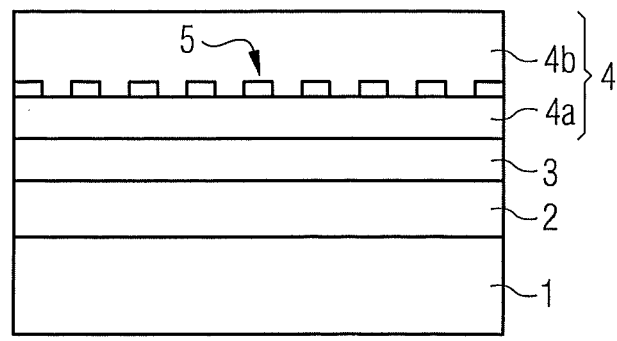

After growth of the masking layer 5, the second sublayer 4b of the first semiconductor layer 4 is grown, as illustrated in FIG. 5. The first sublayer 4a and the second sublayer 4b together form the first GaN semiconductor layer 4. By reason of the openings in the masking layer 5 the second sublayer 4b of the first GaN semiconductor layer 4 is in direct contact with the first sublayer 4a at least in partial regions. Embedding the masking layer 5 into the first GaN semiconductor layer 4 has the advantage that crystal quality is improved and in particular density of the dislocations in the first GaN semiconductor layer 4 is reduced.

Figure 6:
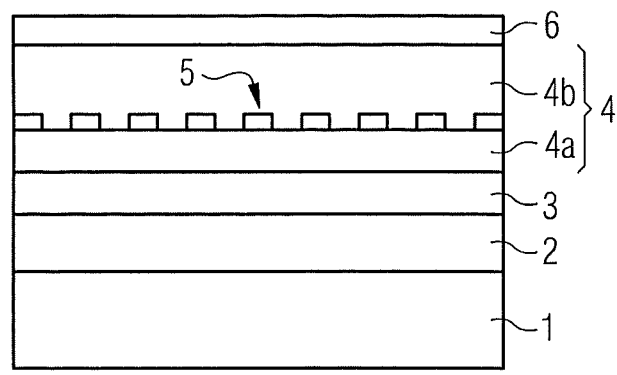

When the total thickness of the first GaN semiconductor layer 4 is preferably more than 500 nm, e.g., about 1300 nm, growth of the first GaN semiconductor layer 4 is terminated and, subsequently, as illustrated in FIG. 6, an intermediate layer consisting of AlN or AlGaN is grown. By reason of its aluminium content, the intermediate layer 6 has a smaller lattice constant than GaN. This type of intermediate layer 6 can thus produce a compressive stress in a subsequently grown layer. This effect is greater the higher the aluminium proportion in the intermediate layer 6. Preferably, the intermediate layer 6 is thus free of gallium and consists advantageously of AlN.

Figure 7:
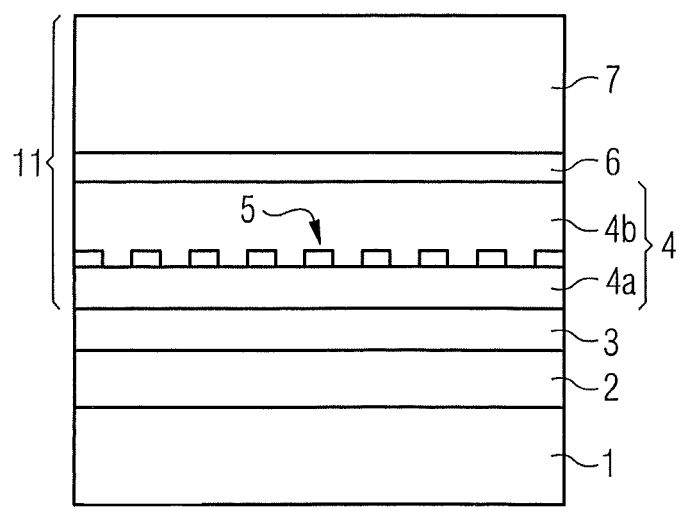

As illustrated in FIG. 7, in a further method step a second GaN semiconductor layer 7 is grown onto the intermediate layer 6. The first GaN semiconductor layer 4 with the masking layer 5 embedded therein, the intermediate layer 6 and the second GaN semiconductor layer 7 together form a stress layer structure 11. The stress layer structure 11 advantageously has a compressive stress which counteracts a tensile stress, which is produced by the growth substrate 1, during cooling of the layer sequence from the growth temperature of about 1000° C. to room temperature.

The compressive stress in the stress layer structure 11 is achieved on the one hand by virtue of the fact that the first GaN semiconductor layer 4 has grown on the underlying buffer layer 2 or transition layer 3 which each have a smaller lattice constant than GaN. The compressive stress built up in this manner in the first GaN semiconductor layer 4 relaxes, during growth with an increasing layer thickness, at least slightly by reason of dislocations in the semiconductor material. This compressive stress is built up again through the intermediate layer 6 which is inserted between the first GaN semiconductor layer 4 and the second GaN semiconductor layer 7 and preferably has AlN and therefore a smaller lattice constant than GaN.

Since a particularly low dislocation density is achieved by the method described herein, in particular by insertion of the masking layer into the first GaN semiconductor layer 4 and/or advantageous oxygen-doping of the buffer layer 2, the first GaN semiconductor layer 4 and the second GaN semiconductor layer 7 can each be designed to be comparatively thick, without the compressive stress relaxing to a significant extent. The first GaN semiconductor layer 4 can have in particular a thickness of 500 nm or more, e.g., about 1300 nm, and the second GaN semiconductor layer 7 can have a thickness of 1000 nm or more, e.g., about 1400 nm. The total thickness of the stress layer structure 11 is preferably 2 μm or more. This type of thick, compressively stressed stress layer structure 11 advantageously reduces the tensile stresses produced during cooling of the growth substrate such that a functional semiconductor layer of an optoelectronic component grown on the stress layer structure 11 is of a high quality, in particular it has a particularly low dislocation density.

A particular advantage of the stress layer structure 11 is that only a single intermediate layer 6 is contained therein. A further reduction in the dislocation density is achieved in this manner. Preferably, in the stress layer structure 11 and/or in the subsequent functional semiconductor layer sequence of an optoelectronic component a dislocation density of less than $1 \times 10^9$ cm$^{-2}$ is achieved. Particularly preferably, the dislocation density is even less than $5 \times 10^8$ cm$^{-2}$. This case exploits the fact that the introduction of several intermediate layers can cause an increase in the dislocation density. Therefore, the dislocation density can be reduced by the use of only one single intermediate layer 6, as described herein.

Figure 8:
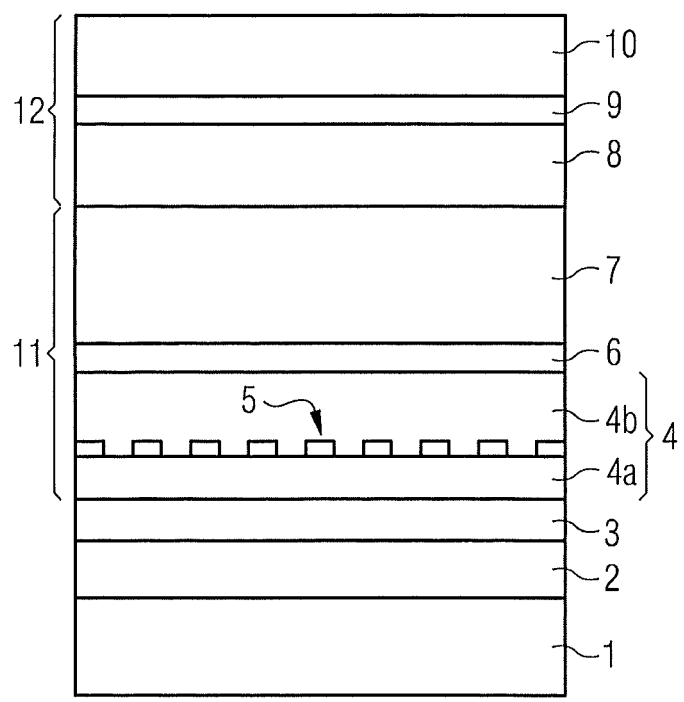

In a next method step, the functional semiconductor layer sequence 12 of an optoelectronic component is grown onto the previously grown stress layer structure 11, as illustrated in FIG. 8. The functional semiconductor layer sequence 12 of the optoelectronic component is based upon a nitride compound semiconductor.

The functional semiconductor layer sequence 12 contains in particular an active layer 9 of the optoelectronic component. The active layer 9 can be in particular a radiation-emitting layer or a radiation-receiving layer. The active layer 9 comprises, e.g., In$_x$Al$_y$Ga$_{1-x-y}$N with 0<x<1, 0<y<1 and x+y<1. The active layer can be formed, e.g., as a pn-transition, as a double heterostructure, as a single quantum well structure or multiple quantum well structure. The designation "quantum well structure" thereby includes any structure in which charge carriers undergo quantization of their energy states by reason of confinement. In particular, the designation "quantum well structure" does not include any detail regarding the dimensionality of the quantization. Therefore, it includes inter alia quantum wells, quantum wires and quantum dots and each combination of these structures.

Furthermore, the functional semiconductor layer sequence 12 contains, e.g., a first semiconductor region 8 and a second semiconductor region 10, wherein the first semiconductor region 8 is, e.g., n-doped and the second semiconductor region 10 is, e.g., p-doped. The first semiconductor region 8 and the second semiconductor region 10 can each be composed of several sublayers.

The layer stack of the optoelectronic component illustrated in FIG. 8 can be provided in a manner known per se with electrical contacts (not illustrated) to introduce a current into the active layer and thus to effect, e.g., an emission of radiation.

Figure 9:
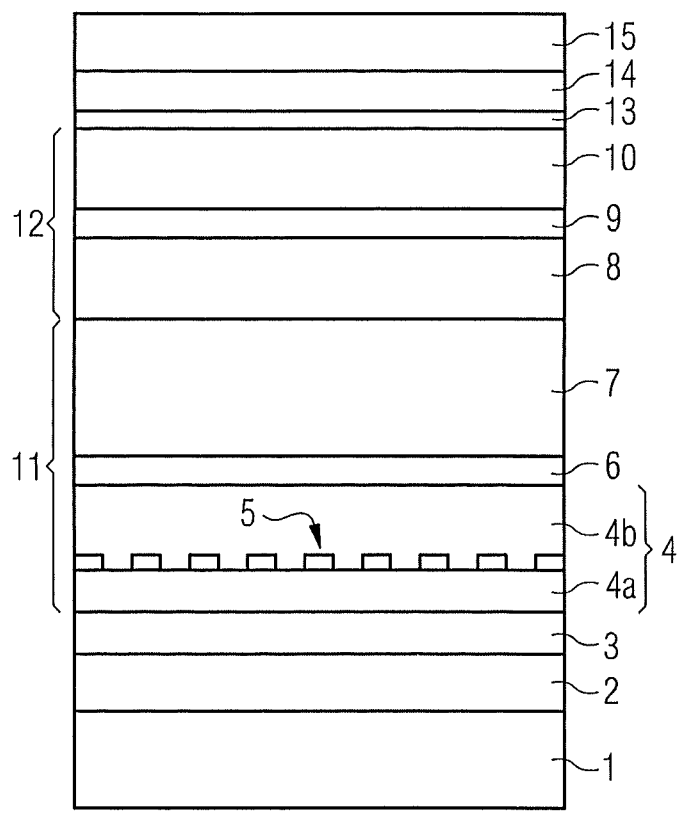

Preferably, the optoelectronic component is formed as a so-called "thin-film" component. This is effected, e.g., as illustrated in FIG. 9 such that a reflective layer 13 is initially applied to the side of the functional semiconductor layer sequence 12 facing away from the growth substrate 1. The reflective layer 13 can be, e.g., a silver layer.

Subsequently, on the side facing away from the growth substrate, the layer stack connects to a carrier substrate 15, e.g., by a connection layer 14. The connection layer 14 can be, e.g., a solder layer. Further intermediate layers which to simplify the illustration are not illustrated in this case can be contained between the reflective layer 13 and the solder layer 14. These intermediate layers can be, e.g., adhesion-promoter layers, wetting layers or diffusion barrier layers.

Advantageously, the carrier substrate 15 does not have to be suitable for epitaxial growth of a nitride compound semiconductor material and can thus be selected in an advantageous manner on the basis of other criteria such as, e.g., high electrical and/or thermal conductivity.

Figure 10:
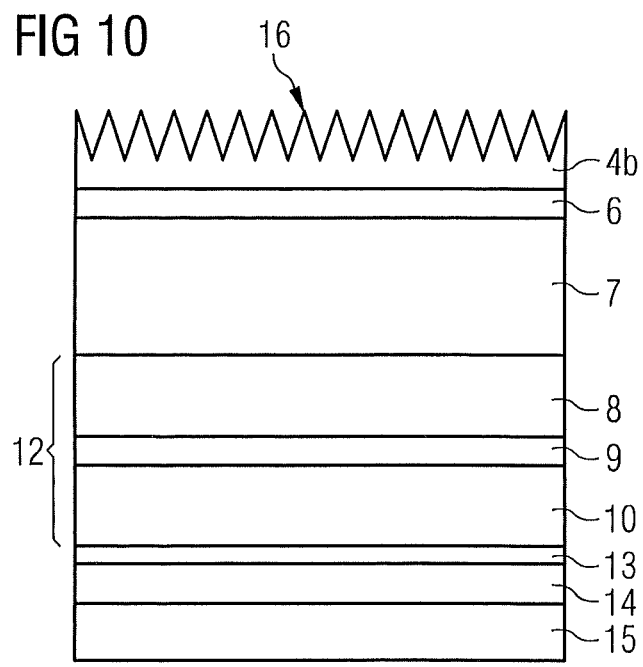

In a further method step, the growth substrate 1 is detached from the side of the layer stack facing away from the carrier substrate 15, as illustrated in FIG. 10. The side of the semiconductor layer sequence facing towards the original growth substrate thus preferably serves as a radiation exit surface in the finished optoelectronic component. After detachment of the growth substrate, further layers of the originally applied layer stack such as in particular the buffer layer 2, the transition layer 3 and/or at least parts of the stress layer structure 11 can also be removed. This can be performed, e.g., by an etching process. For example, in the case of the optoelectronic component illustrated in FIG. 10, the growth substrate, the buffer layer, the transition layer and the first sublayer of the first semiconductor layer having the masking layer embedded therein have been removed and are thus no longer contained in the finished optoelectronic component. Advantageously, the second sublayer 4b has been provided with a coupling-out structure 16 on the boundary surface which is now used as a radiation exit surface.

The optoelectronic component which is produced by the method described herein is characterized in particular by a particularly low dislocation density, thus advantageously increasing the level of efficiency of the optoelectronic component.

Our methods and components are not limited by the description using the examples. Rather, this disclosure includes any new feature and any combination of features included in particular in any combination of features in the appended claims, even if the feature or combination itself is not explicitly stated in the claims or examples.

The invention claimed is:

1. A method of producing a nitride compound semiconductor component comprising:
   providing a growth substrate having a silicon surface,
   growing a buffer layer containing an aluminium-containing nitride compound semiconductor onto the silicon surface,
   growing a stress layer structure that produces a compressive stress, and
   growing a functional semiconductor layer sequence onto the stress layer structure, wherein
   the stress layer structure comprises a first GaN semiconductor layer and a second GaN semiconductor layer,
   a dopant concentration in the first and/or second GaN semiconductor layer is not more than $1*10^{19}$ cm$^{-3}$,
   a masking layer is embedded in the first GaN semiconductor layer,
   an Al(Ga)N-intermediate layer that produces a compressive stress is disposed between the first GaN semiconductor layer and the second GaN semiconductor layer,
   the stress layer structure does not contain further Al(Ga)N-intermediate layers, and
   a dislocation density in the functional semiconductor layer sequence is less than $5\times10^8$ cm$^{-2}$.

2. The method according to claim 1, wherein the buffer layer is doped with oxygen.

3. The method according to claim 1, wherein the first GaN semiconductor layer has a thickness of 500 nm or more.

4. The method according to claim 1, wherein the second GaN semiconductor layer has a thickness of 1000 nm or more.

5. The method according to claim 1, wherein a total thickness of the stress layer structure is 2 µm or more.

6. The method according to claim 1, wherein the first GaN semiconductor layer and/or the second GaN semiconductor layer are doped.

7. The method according to claim 1, wherein at least one transition layer consisting of $Al_xGa_{1-x}N$ with $0<x<1$ is disposed between the buffer layer and the stress layer structure.

8. The method according to claim 1, wherein the masking layer has a silicon nitride.

9. The method according to claim 1, wherein the masking layer has an average thickness of less than 2 nm.

10. The method according to claim 1, wherein the silicon surface is a (111)-plane.

11. The method according to claim 1, wherein the growth substrate is detached after growth of the functional semiconductor layer sequence.

12. The method according to claim 1, wherein the functional semiconductor layer sequence connects to a carrier substrate on a side opposite to the growth substrate.

13. The method according to claim 1, wherein the nitride compound semiconductor component is an optoelectronic component.

14. The method according to claim 1, wherein the functional semiconductor layer sequence has an active layer.

15. A method of producing a nitride compound semiconductor component comprising:
   providing a growth substrate having a silicon surface,
   growing a buffer layer containing an aluminium-containing nitride compound semiconductor onto the silicon surface,
   growing a stress layer structure that produces a compressive stress, and
   growing a functional semiconductor layer sequence onto the stress layer structure, wherein
   the stress layer structure comprises a first GaN semiconductor layer and a second GaN semiconductor layer,
   a dopant concentration in the first and/or second GaN semiconductor layer is not more than $1*10^{19}$ cm$^{-3}$,
   a masking layer is embedded in the first GaN semiconductor layer,
   an Al(Ga)N-intermediate layer that produces a compressive stress is disposed between the first GaN semiconductor layer and the second GaN semiconductor layer,
   the stress layer structure does not contain further Al(Ga)N-intermediate layers, the buffer layer comprises an oxygen-doped AlN semiconductor material in an amount such that oxygen content in the buffer layer is 1% to 5%, and
   a dislocation density in the functional semiconductor layer sequence is less than $5\times10^8$ cm$^{-2}$.

* * * * *